United States Patent
Nakamura et al.

(10) Patent No.: US 7,196,426 B2
(45) Date of Patent: Mar. 27, 2007

(54) MULTILAYERED SUBSTRATE FOR SEMICONDUCTOR DEVICE

(75) Inventors: Jyunichi Nakamura, Nagano (JP); Tadashi Kodaira, Nagano (JP); Shunichiro Matsumoto, Nagano (JP); Hironari Aratani, Nagano (JP); Takanori Tabuchi, Nagano (JP); Takeshi Chino, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/995,384

(22) Filed: Nov. 24, 2004

(65) Prior Publication Data

US 2005/0087860 A1    Apr. 28, 2005

Related U.S. Application Data

(62) Division of application No. 10/649,745, filed on Aug. 28, 2003, which is a division of application No. 10/281,163, filed on Oct. 28, 2002, now Pat. No. 6,759,739.

(30) Foreign Application Priority Data

Oct. 31, 2001    (JP) .............................. 2001-334744

(51) Int. Cl.
- *H01L 23/48* (2006.01)
- *H01L 23/498* (2006.01)
- *H05K 3/00* (2006.01)
- *H05K 3/34* (2006.01)
- *H05K 1/02* (2006.01)

(52) U.S. Cl. .............. 257/778; 257/E23.062; 257/700; 257/701; 257/758; 257/704; 257/707; 257/710; 257/787; 257/788; 257/79; 257/712; 257/713; 257/720; 257/717; 257/E23.178; 257/E23.007; 257/E23.067; 257/E23.069; 257/E23.063

(58) Field of Classification Search ............. 257/778, 257/700, 701, 704, 707, 170, 712, 173, 717, 257/720, 758, 787, 788, 790, 668, E23.178, 257/E23.007, E23.062, E23.067, E23.069, 257/E23.063

See application file for complete search history.

(56) References Cited

U.S. PATENT DOCUMENTS

| | | |
|---|---|---|
| 6,191,483 B1 * | 2/2001 | Loo ........................ 257/737 |
| 6,418,615 B1 | 7/2002 | Rokugawa et al. |
| 2001/0003049 A1 | 6/2001 | Fukusawa et al. |
| 2002/0001937 A1 | 1/2002 | Kikuchi et al. |

FOREIGN PATENT DOCUMENTS

| | | |
|---|---|---|
| JP | 2000-323613 | 11/2000 |
| JP | 2003-23613 | * 11/2000 |
| KR | 1999-63586 A | 7/1999 |

* cited by examiner

Primary Examiner—Alexander Oscar Williams
(74) Attorney, Agent, or Firm—Morgan, Lewis & Bockius LLP

(57) ABSTRACT

A multilayered substrate for a semiconductor device, which has a multilayered substrate body formed of a plurality sets of a conductor layer and an insulation layer, and having a face for mounting a semiconductor element thereon and another face for external connection terminals, the face for mounting a semiconductor device being provided with pads through which the substrate is connected to a semiconductor element to be mounted thereon, and the face for external connection terminals being provided with pads through which the substrate is connected to an external electrical circuit, wherein a reinforcing sheet is respectively joined to the face for mounting a semiconductor element thereon and the face for external connection terminals of the multilayered substrate body.

1 Claim, 10 Drawing Sheets

MULTILAYERED SUBSTRATE FOR SEMICONDUCTOR DEVICE

This application is a divisional of U.S. Ser. No. 10/649,745, filed Aug. 28, 2003, now pending, which is a divisional of U.S. patent application Ser. No. 10/281,163, filed Oct. 28, 2002, now U.S. Pat. No. 6,759,739, issued Jul. 6, 2004, all of which is incorporated by reference.

BACKGROUND OF THE INVENTION

1. Field of the Invention

The present invention relates to a multilayered substrate for a semiconductor device, and more particularly, to a multilayered substrate for a semiconductor device, which has a multilayered substrate body formed of a plurality of sets of a conductor layer and an insulation layer, i.e., a laminate of alternate conductor and insulation layers, and having a face for mounting semiconductor element thereon and another face for external connection terminals, the face for mounting semiconductor device being provided with pads through which the substrate is connected to a semiconductor element to be mounted thereon, and the face for external connection terminals being provided with pads through which the substrate is connected to an external electrical circuit.

2. Description of the Related Art

A multilayered substrate for a semiconductor device as shown in FIG. 10 is proposed in Japanese Unexamined Patent Publication No. 2000-323613 (corresponding to U.S. Pat. No. 6,418,615). Multilayered substrate body 105 is included in multilayered substrate 100 for a semiconductor device shown in FIG. 10 that is composed by arranging conductor wiring 102 in multiple layers stacked with insulation layers 104 composed of a polyimide resin or a resin such as polyphenylene ether. One side of this multilayered substrate body 105 is a face for mounting semiconductor elements on which is formed semiconductor element pads 120a that are connected to electrode terminals 108 of semiconductor element 106 that is mounted thereon, while the other side of multilayered substrate body 105 is a face for external connection terminals on which is formed external connection terminal pads 124 that are attached to solder balls 122 as external connection terminals. The face for mounting semiconductor devices and the face for external connection terminals of this multilayered substrate body 105 are covered with solder resist 126 with the exception of semiconductor element pads 120a and external connection terminal pads 124.

In this type of multilayered substrate body 105, the conductor wiring 102 and/or pads formed on both sides of each insulation layer 104 (pads 120 for connecting two wiring layers to each other, pads 124 for external connection terminals or pads 120a for electrode terminals of semiconductor element) are electrically connected by vias 128 formed passing through insulation layers 104. These vias 128 are formed in openings 130 which are opened in the side of insulation layer 104 having the face for external connection terminals, and have the bottom formed by the faces of conductor wiring 102 or pads 120 and 120a formed on the side of the same insulation layer 104 having the face for mounting semiconductor elements. Moreover, a metal frame 117 having a prescribed strength can be joined to the periphery of multilayered substrate body 105 in order to improve handling ease, etc. during transport and so forth of multilayered substrate 100 for a semiconductor device.

As shown in FIGS. 11A through 11F, multilayered substrate 100 for a semiconductor device shown in FIG. 10 can be produced by alternately forming conductor wiring and insulation layers from a semiconductor element mounting layer having a face for mounting semiconductor elements in the direction of an external connection terminal attachment layer having a face for external connection terminals.

To begin with, seed layer 142 is formed on one side of a metal sheet in the form of copper sheet 140 (FIG. 11A). This seed layer 142 is composed of chromium (Cr) layer 141a, which is in direct contact with the face of copper sheet 140, and copper (Cu) layer 141b formed on chromium (Cr) layer 141a as shown in FIG. 12, which is an enlarged view of the section indicated with circle A in FIG. 11A.

Semiconductor element pads 120a, to which electrode terminals 108 of semiconductor element 106 are later connected and which are composed of copper, are formed by forming a photoresist pattern (not shown) on seed layer 142 formed on one side of copper sheet 140, exposing seed layer 142 at the sections where semiconductor element pads 120a are formed, and then performing electrolytic plating using seed layer 142, and particularly copper layer 141b, as the power supply layer (FIG. 11B).

Insulation layer 104 is formed by coating a thermosetting resin in the form of a polyimide resin by printing and so forth followed by curing so as to cover semiconductor element pads 120a formed in this manner (FIG. 1C). Continuing, openings 130 for forming vias are formed in insulation layer 104 by laser light such as YAG laser light or carbon dioxide laser light (FIG. 1D).

Seed layer 142', composed of a chromium (Cr) layer and copper (Cu) layer, is formed over the entire surface of insulation layer 104, including the inner walls of formed openings 130 (FIG. 11E). Next, sections corresponding to vias 128 and conductor wiring 102 (FIG. 10) are formed by electrolytic copper plating using the resist pattern (not shown) formed on seed layer 142' as a mask, and seed layer 142' as a power supply layer.

Next, vias 128 and conductor wiring 102 are formed in the surface of insulation layer 104 as shown in FIG. 11F by removing seed layer 142', except for those sections corresponding to vias 128 and conductor wiring 102, by etching.

Continuing, conductor wiring and insulation layers are sequentially formed from the side of the semiconductor element mounting layer having a face for mounting semiconductor elements in the direction of the external connection terminal attachment layer having a face for external connection terminals by repeating the steps of FIGS. 11C through 11F, thereby allowing the obtaining of intermediate 100a shown in FIG. 13. On one side of multilayered substrate body 105 of the resulting intermediate 100a, copper sheet 140 is joined via seed layer 142 to the face for mounting semiconductor element on which semiconductor mounting pads 120a are formed, and on the other side of multilayered substrate body 105, external connection terminal pads 124 are formed. Copper sheet 140 fulfills the role of a reinforcing sheet of multilayered substrate body 105, and facilitates handling of intermediate 100a during transport and so forth.

Finally, it is necessary to remove copper sheet 140 from intermediate 100a by etching in order to obtain multilayered substrate 100 for a semiconductor device shown in FIG. 10. By forming chromium (Cr) layer 141a, which is not etched by the etching solution of copper sheet 140, as a portion of seed layer 142, the progress of the etching can be inhibited when etching has reached chromium (Cr) layer 141a of seed layer 142 during etching of copper sheet 140, and etching of copper sheet 140 ends at the point the entire surface of chromium (Cr) layer 141a of seed layer 142 is exposed. Next, by removing chromium (Cr) layer 141a and copper (Cu) layer 141b by etching, the surface of semiconductor element pads 120a is exposed, thereby allowing the obtaining of multilayered substrate 100 for a semiconductor device shown in FIG. 10.

Multilayered substrate 100 for a semiconductor device shown in FIG. 10 can be produced so that the face on which semiconductor elements are mounted is as flat as possible and the thickness of the substrate is as thin as possible. However, the inventors of the present invention found that, even if multilayered substrate 100 for a semiconductor device shown in FIG. 10 is reinforced by joining a metal frame 117 on the face for mounting semiconductor elements of multilayered substrate body 105, warping occurs easily caused by a difference in the coefficients of thermal expansion between metal frame 117 and multilayered substrate body 105 composed mainly of a resin, and that warping also occurs easily in intermediate 100a (FIG. 13) during its production process caused by a difference in the coefficients of thermal expansion between copper sheet 140 and multilayered substrate body 105 composed mainly of a resin.

If a thick metal frame 117 is used to prevent the occurrence of this warping, the characteristics of a thin and lightweight multilayered substrate 100 for a semiconductor device are lost.

SUMMARY OF THE INVENTION

The object of the present invention is to provide a multilayered substrate for a semiconductor device in which the face on which semiconductor elements are mounted can be as flat as possible and its thickness can be as thin as possible, and which can prevent warping caused by a difference in the coefficients of thermal expansion between the element members.

In order to achieve the above object, the present inventors thought that it would be effective to juxtaposition a multilayered substrate body composed mainly of resin between a metal frame and a metal sheet, and as a result of conducting studies on this, were able to achieve the present invention.

The present invention is a multilayered substrate for a semiconductor device, which has a multilayered substrate body formed of a plurality of sets of a conductor layer and an insulation layer, i.e., a laminate of alternate conductor and insulation layers, and having a face for mounting semiconductor element thereon and another face for external connection terminals, the face for mounting semiconductor device being provided with pads through which the substrate is connected to a semiconductor element to be mounted thereon, and the face for external connection terminals being provided with pads through which the substrate is connected to an external electrical circuit, wherein a reinforcing sheet is respectively joined to the face for external connection terminals and the face for mounting semiconductor element thereon.

A metal sheet having through holes formed so as to correspond to each external connection terminal pad, and the entire surface of which, including the inner wall surfaces of these through holes, has been insulation treated, is preferable for the reinforcing sheet joined to the face for external connection terminals. In particular, an aluminum sheet in which a plurality of through holes are formed, and the entire surface of which, including the inner wall surfaces of each of the above through holes, is anodized can be used preferably.

As the reinforcing sheet joined to the face for external connection terminals, a sheet of ceramic or resin, which has a strength and a coefficient of thermal expansion corresponding to those of the reinforcing sheet jointed to the face for mounting semiconductor elements, may be used.

When adhering said insulation treated metal sheet to the face for external connection terminals of the multilayered substrate body, by using an adhesive containing particles of a diameter that is able to maintain a prescribed gap between the above insulation treated metal sheet and face for external connection terminals such that adhesive is not extruded into the through holes of the above insulation treated metal sheet when the insulation treated metal sheet and face for external connection terminals are pressed together, attachment of external connection terminals can be carried out easily.

A metal frame is preferable for the reinforcing sheet joined to the face for mounting semiconductor elements. In particular, a portion of a metal sheet on which a multilayered substrate body is formed on one side can be used as such a frame, whereby the occurrence of warping of the multilayered substrate for a semiconductor device in the production process can be prevented. In this case, a frame that functions as a reinforcing sheet can be formed by etching a metal sheet on which a multilayered substrate body is formed on one side and removing only the metal material in the region where a semiconductor element is mounted.

In the multilayered substrate for a semiconductor device of the present invention, pads formed into the shape of bumps so that their tips protrude from the face for mounting a semiconductor element of the multilayered substrate body may be used as the pads for mounting semiconductor elements on the multilayered substrate. As a result of using such bump-shaped pads, even a semiconductor element provided with electrode terminals having flat tips can be easily joined to the multilayered substrate of the present invention by means of these bump-shaped pads.

According to the present invention, a multilayered substrate body in which a plurality of conductor wiring are formed in multiple layers with insulation layers between them allows the face on which semiconductor elements are mounted to be made as flat as possible, and its thickness can be made to be as thin as possible.

Moreover, since a multilayered substrate body composed mainly of insulating resin is juxtapositioned between an insulation treated metal sheet and metal frame, the multilayered substrate for a semiconductor device can be prevented from warping, even if there is a difference in the coefficients of thermal expansion between the multilayered substrate body and these metal members.

Moreover, since a multilayered substrate body is juxtapositioned between an insulation treated metal sheet and metal frame having rigidity, handling of a multilayered substrate for a semiconductor device can be made to be easier during transport and so forth.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

Figure 1:
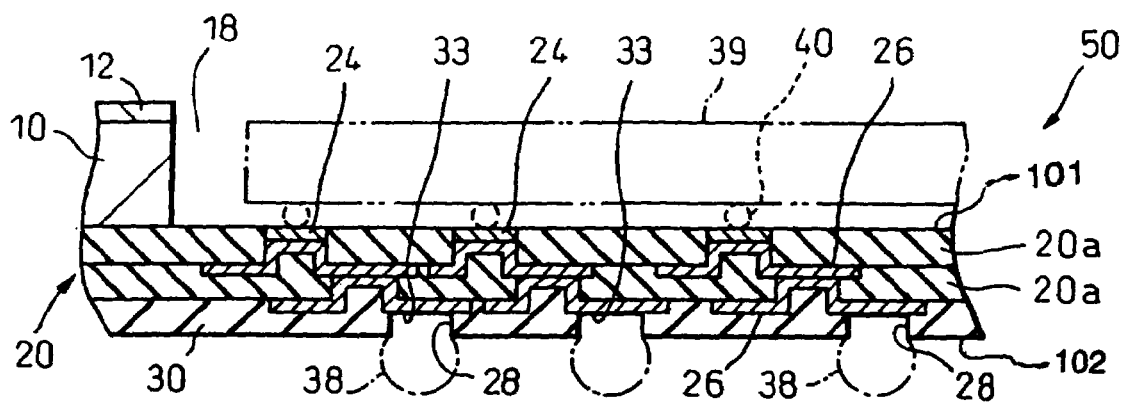
FIG. 1 is a partial cross-sectional view that illustrates an embodiment of the multilayered substrate for a semiconductor device according to the present invention.

An example of the multilayered substrate for a semiconductor device of the present invention is shown in FIG. 1. In multilayered substrate 50 for a semiconductor device shown in FIG. 1, multilayered substrate body 20, which is composed by conductor wiring 26 being formed in multiple layers via insulating resin layers 20a, is juxtaposed between copper frame 10, having a surface on which nickel film 12 is formed, and insulation treated metal sheet 30. This copper frame 10 and insulation treated metal sheet 30 have the role of a reinforcing material for multilayered substrate body 20. Reference numeral 101 represents the face for mounting a semiconductor element (or the first face) and reference numeral 102 represents the face for external connection terminals (or the second face).

Figure 2:
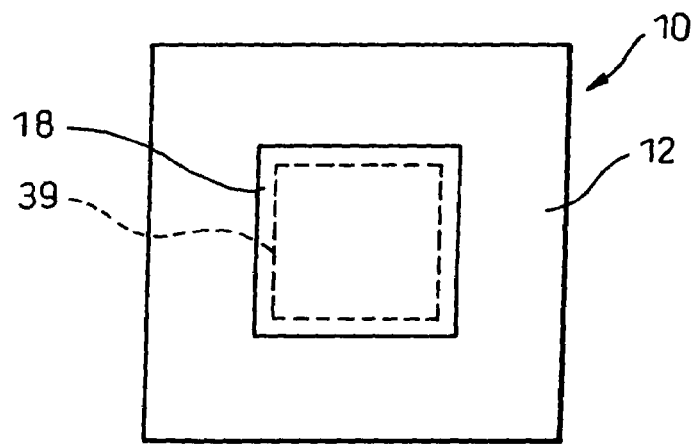
FIG. 2 is a top view of the frame shown in FIG. 1.

Copper frame 10 is joined to the face for mounting semiconductor elements of multilayered substrate body 20, on which is formed solder layer 24 serving as semiconductor element pads that are connected with the electrode terminals of semiconductor element 39. As shown in FIG. 2, opening 18 is formed in the center of frame 10 so as to allow the insertion of semiconductor element 39.

As shown in FIG. 1, each of the electrode terminals of semiconductor element 39 inserted into opening 18 of frame 10 is joined to solder layer 24 serving as semiconductor element pads formed on the face for mounting semiconductor elements of multilayered substrate body 20.

Figure 3:
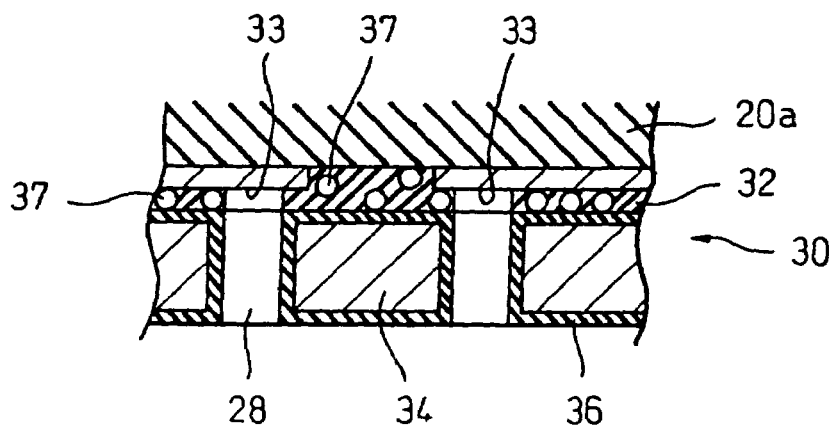
FIG. 3 is an enlarged, partial cross-sectional view of the insulation treated metal sheet shown in FIG. 1, FIGS. 4A through 4G illustrate an example of the production method of the multilayered substrate for a semiconductor device shown in FIG. 1.

Insulation treated metal sheet 30 is adhered to the face for external connection terminals, on which external connection terminal pads 33 are formed, of multilayered substrate body 20. As shown in FIG. 3, this insulation treated metal sheet 30 is formed from metal sheet 34, in which through holes 28 are provided by which solder balls 38 (FIG. 1) serving as external connection terminals are attached to external connection terminal pads 33, and insulating film 36 that covers its entire surface, including the inner wall surfaces of through holes 28. An aluminum sheet is preferably used for metal sheet 34, and an alumite ($Al_2O_3$) layer can be formed for insulating film 36. Metal sheets other than an aluminum sheet can also be used. For example, a sheet of any metal material in which an insulating resin film is formed on the entire surface, including the inner wall surfaces of through holes 28, can be used.

Adhesion of insulation treated metal sheet 30 and multilayered substrate body 20 is carried out by adhesive 32 containing insulating fine particles 37. Insulating fine particles 37 blended into adhesive 32 prevent adhesive 32 from being extruded into through holes 28 by maintaining a prescribed gap between insulation treated metal sheet 30 and insulating resin layer 20a even if insulation treated metal sheet 30 is pressed against multilayered substrate body 20 for the purpose of adhesion when insulation treated metal sheet 30 is adhered to insulating resin film 20a of the outermost layer of multilayered substrate body 20. Thus, the diameter of insulating fine particles 37 is selected so as to be able to maintain a gap that makes it possible to prevent extrusion of adhesive 32 into through holes 28 between insulation treated metal sheet 30 and multilayered substrate body 20. An adhesive that does not contain insulating fine particles 37 can also be used by experimentally confirming the gap that makes it possible to prevent extrusion of adhesive 32 into through holes 28, and then adjusting the pressing force during adhesion accordingly.

The multilayered substrate 50 for a semiconductor device shown in FIG. 1 can be produced in the manner described below.

To begin with, on two exposed surfaces of a compound metal sheet in which two metal sheets are laminated into a single unit, a patterned solder layer (wiring layer), which is made from a metal that is substantially not etched by an etching liquid for the metal sheets, and patterned insulating layer 20a are formed. This patterned solder layer provides semiconductor element pads 24 on the face for mounting a semiconductor element of the multilayered substrate. Insulating layer 20a is patterned so as to have openings that expose at least a portion of each pad 24. A wiring layer connected to pads 24 through the openings of this insulating layer is formed, and an insulating layer is formed having openings leading to the newly formed wiring layer. After repeating alternate formation of the wiring layer and insulating layer for the required number of times (external connection terminal pads 33 are provided through the formation of the final wiring layer), the compound metal sheet is separated to obtain an intermediate in which multilayered substrate body 20 is formed on one side of one metal sheet. The metal material in the region where a semiconductor element is mounted is removed from the metal sheet of this intermediate, and together with exposing semiconductor element pads, a frame is formed that is joined to the face for mounting a semiconductor element of the multilayered substrate body, followed by adhering an insulation treated metal sheet to the face for external connection terminals of the multilayered substrate body to obtain multilayered substrate 50 for a semiconductor device shown in FIG. 1.

Next, a detailed explanation is provided of the production method of multilayered substrate 50 for a semiconductor device shown in FIG. 1 with reference to the drawings.

Figure 4A:
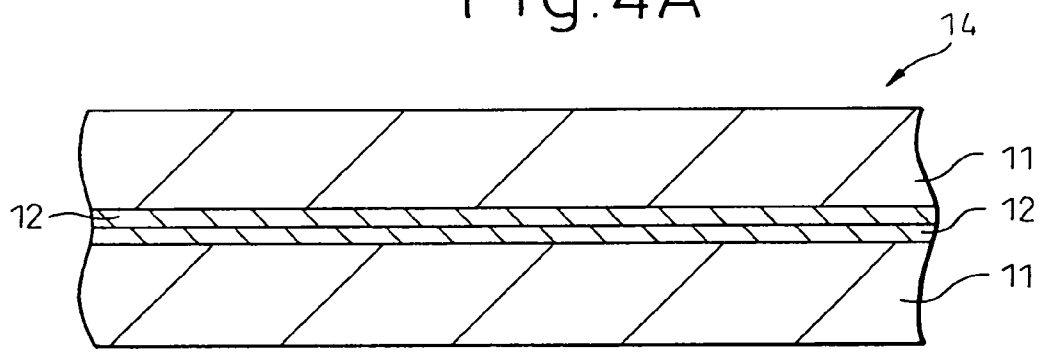
Figure 5:
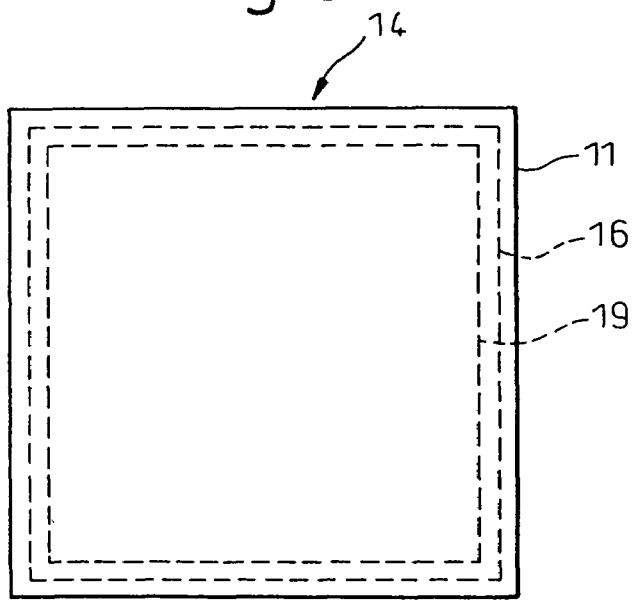
FIG. 5 illustrates the metal sheet used in the production method shown in FIGS. 4A through 4G.

To begin with, a copper sheet 11 having a thickness of about 0.3 mm is used for the metal sheet, and nickel film 12 is formed on one side. This nickel film 12 is a metal film that is resistant to etching liquid that etches copper sheet 11. Nickel film 12 can be formed by plating or sputtering and so forth. Two copper sheets 11, on which nickel film 12 is formed on one side in this manner, are laminated so that nickel film 12 is on the inside to integrate into a single unit and form compound metal sheet 14 (FIG. 4A). As shown in FIG. 5, compound metal sheet 14 is formed by adhering the vicinity of the edges of copper sheets 11 (region extending from the edge to broken line 16) with adhesive to integrate into a single unit. This compound metal sheet 14 can be easily separated into individual copper sheets 11 as will be explained later by cutting along broken line 19 in the vicinity of the inside of the region adhered with adhesive.

Figure 4B:
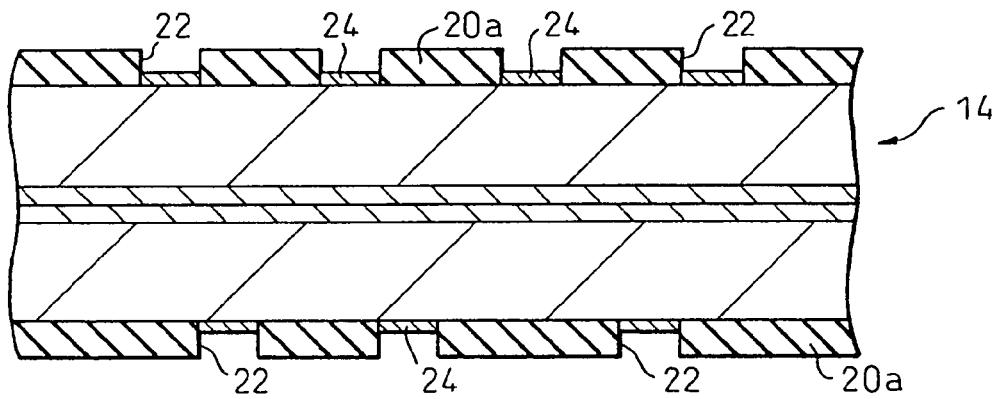

As shown in FIG. 4B, a thermosetting resin or photosensitive resin such as polyimide resin or epoxy resin is applied to both sides of compound metal sheet 14 by printing and so forth and then cured to form insulating resin layer 20a. Openings 22 for forming vias are formed in insulating resin layer 20a by laser light such as YAG laser light or carbon dioxide laser light, or by photolithography. Solder layer 24 is formed on the bottom of openings 22 by electrolytic plating using copper sheet 11, a portion of which is exposed on the bottom of each opening 22, as a power supply layer. Alternatively, after forming solder layer 24 for use as a semiconductor element connecting pad on copper sheet 11, insulating resin layer 20a may be formed followed by forming openings 22, in which solder layer 24 is exposed on the bottom, in insulating resin layer 20a by laser light or photolithography. Solder layer 24 is a layer that is composed of a metal that is substantially not etched by etching liquid for performing etching on copper sheet 11, and provides semiconductor element pads. Insulating resin layer 20a may be formed by adhering a film composed of a resin such as polyimide resin or epoxy resin.

Figure 4C:
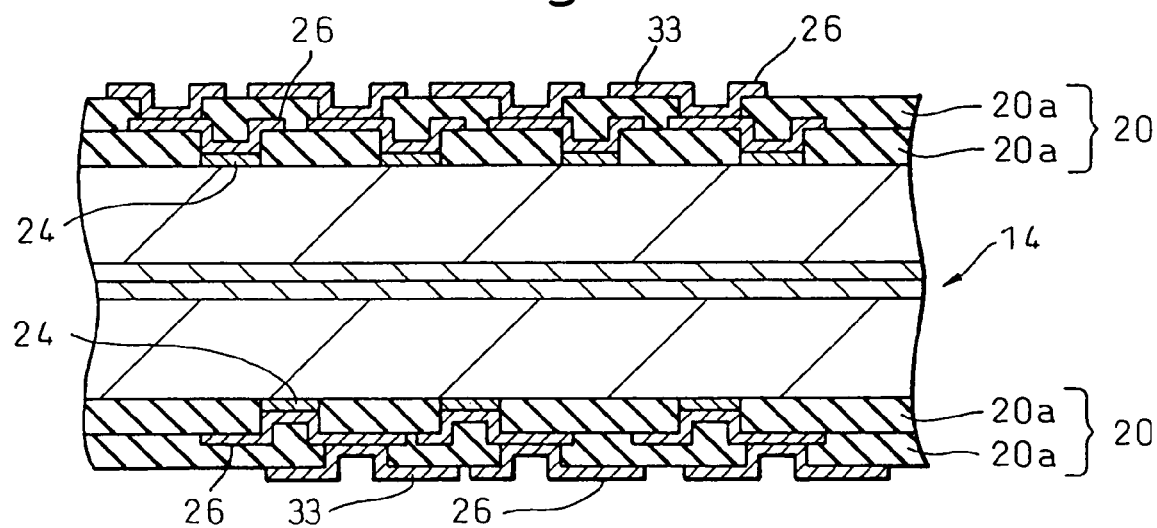

Next, multilayered substrate body 20 is fabricated by alternately forming conducting wiring layer 26 and insulating resin layer 20a on both sides of compound metal sheet 14 using a known method (FIG. 4C).

Formation of conducting wiring layer 26 can be carried out by, for example, forming a copper layer on previously formed insulating layer 20a that is continuous with lower wiring layer 26 through openings 22 formed in this insulating layer 20a by, for example, plating or sputtering, forming a resist pattern on this copper layer, performing electrolytic plating by using this resist pattern as a mask and using the copper layer as a power supply layer, forming conductor wiring layers 26 that contain via holes, and then removing the copper layer other than the portions corresponding to conductor wiring layers 26, including vias, by etching. Formation of insulating resin layer 20a can be carried out by, for example, forming an insulating resin film composed of a thermosetting resin such as polyimide resin or epoxy resin on the formed conducting wiring layer 26, and forming openings 22 for the formation of vias in this insulating resin film by YAG laser light and so forth.

Figure 4D:
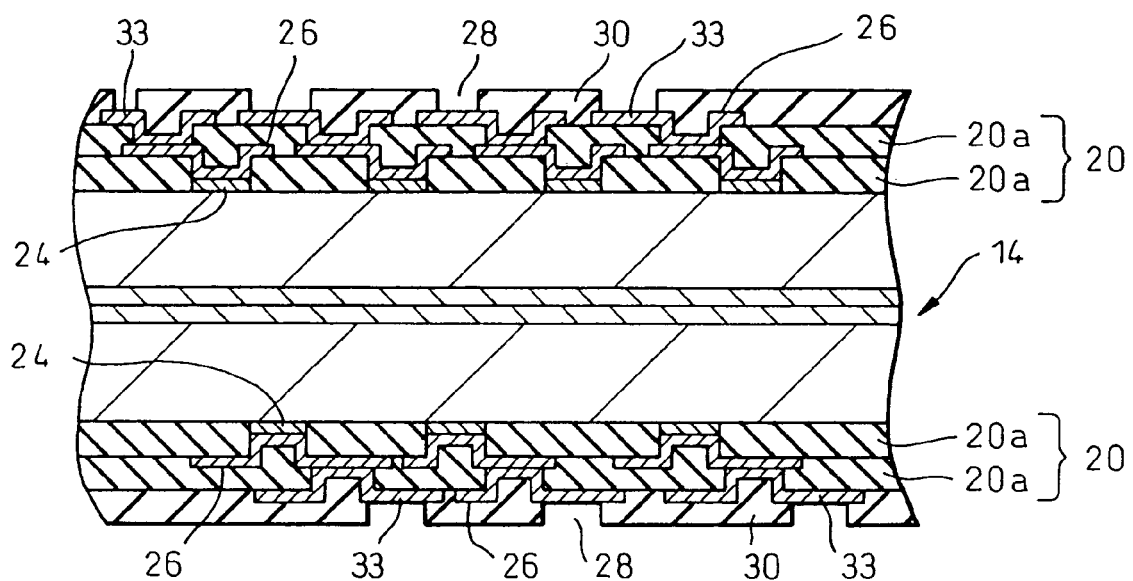
Figure 6A:
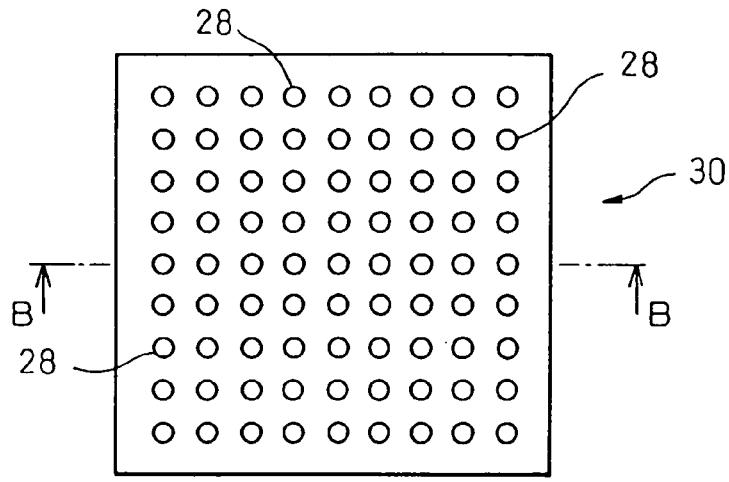
FIG. 6A illustrates the insulation treated metal sheet used in the production method shown in FIGS. 4A through 4G.
Figure 6B:
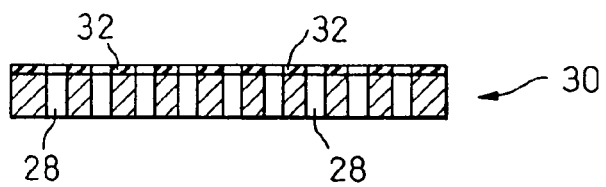
FIG. 6B is a cross-sectional view taken along the line B—B in FIG. 6A.

Insulation treated metal sheet 30 is adhered using adhesive (not shown) on the wiring layer 26 including external connection terminal pads 33 of the outermost layer of each multilayered substrate body 20 formed on both sides of compound metal sheet 14 (FIG. 4D). This insulation treated metal sheet 30 composes the outermost insulating layer at the face for external connection terminals of multilayered substrate body 20. As shown in FIG. 6A, insulation treated metal sheet 30 has through holes 28 at locations corresponding to external connection terminal pads 33, and its entire surface, including the inside wall surfaces of through holes 28, is covered with an insulating film (not shown). Moreover, as shown in FIG. 6B, an adhesive 32 is pre-coated onto the side of insulation treated metal sheet 30 that joins to multilayered substrate body 20.

Figure 7:
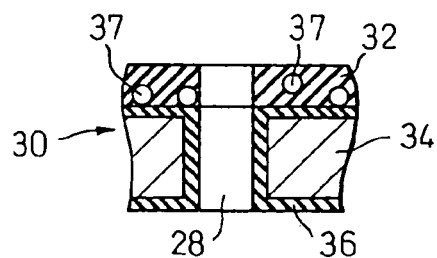
FIG. 7 is an enlarged, partial cross-sectional view of the vicinity of a through hole of the insulation treated metal sheet shown in FIGS. 6A and 6b, FIGS. 8A through 8D illustrate another example of a production method of the multilayered substrate for a semiconductor device shown in FIG. 1, FIGS. 9A and 9B show another example of a reinforcing material joined to a face for external connection terminals of the multilayered substrate for a semiconductor device of the present invention.

FIG. 7 shows an enlarged, partial cross-sectional view of the vicinity of a through hole 28 of insulation treated metal sheet 30. Insulating layer 36 is formed over the entire surface of this metal sheet 30, including the inner wall surfaces of through hole 28. In the case where metal sheet 30 is made of aluminum, insulating layer 36 may be an alumite ($Al_2O_3$) layer obtained by anodic oxidation, or may be a layer of insulating resin. An adhesive 32 containing insulating fine particles 37 of a prescribed diameter is coated onto one side of insulation treated metal sheet 30 as was previously explained.

When multilayered substrate body 20 is formed on both sides of compound metal sheet 14 in this manner, the strength of compound metal sheet 14 is improved as compared with the case of forming multilayered substrate body 20 on one side of a single copper sheet 11, and even if there is a difference in the coefficients of thermal expansion between copper sheet 11 and multilayered substrate body 20 composed mainly of resin, since the directions of warping due to a difference in the coefficients of thermal expansion between copper sheet 11 and multilayered substrate body 20 are mutually opposite on both sides of compound metal sheet 14, the warping that occurs on each side of compound metal sheet 14 can be canceled out. Thus, in the steps explained with reference to FIGS. 4A through 4D, there is no substantial occurrence of warping in compound metal sheet 14 or multilayered substrate body 20, and positioning can be carried out both reliably and easily when forming openings for formation of vias in insulating resin layer 20a by YAG laser light and so forth, and when adhering insulation treated metal sheet 30.

Figure 4E:
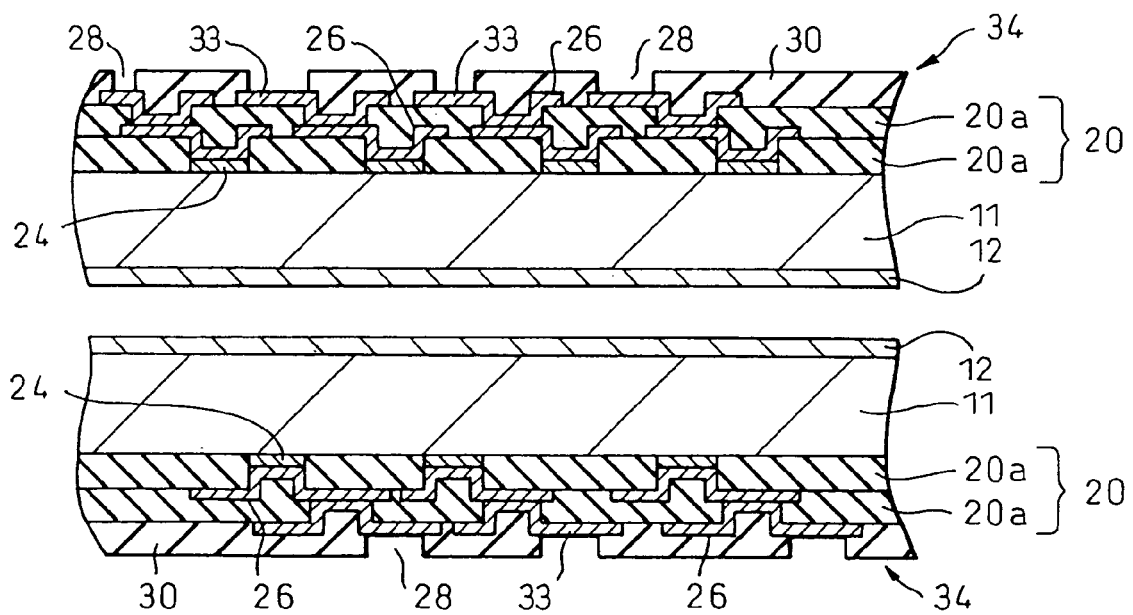

Following adhesion of insulation treated metal sheet 30, an intermediate 34, in which multilayered substrate body 20 is formed on one side of a single copper sheet 11, can be obtained by separating two copper sheets 11 composing compound metal sheet 14 on which multilayered substrate body 20 is formed on both sides, as shown in FIG. 4E. As shown in FIG. 5, separation of the two copper sheets 11 can be carried out easily by cutting compound metal sheet 14 along a line (for example, broken line 19 in FIG. 5) on the inside of their edge regions (regions extending from the edge of copper sheet 11 to broken line 16) that have been laminated with adhesive.

Intermediate 34 obtained in this manner (FIG. 4E) is able to prevent the occurrence of warping even if heat is applied due to multilayered substrate body 20 made mainly of resin being juxtapositioned between copper sheet 11 and insulation treated metal sheet 30.

Figure 4F:
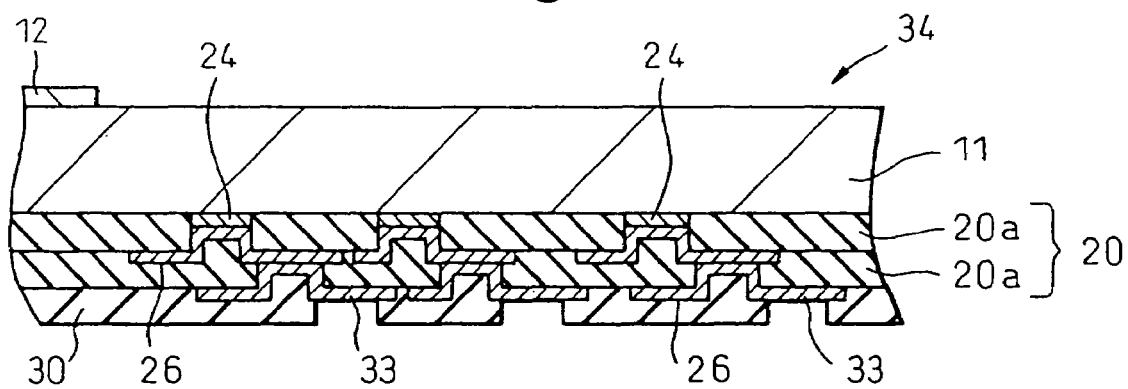
Figure 4G:
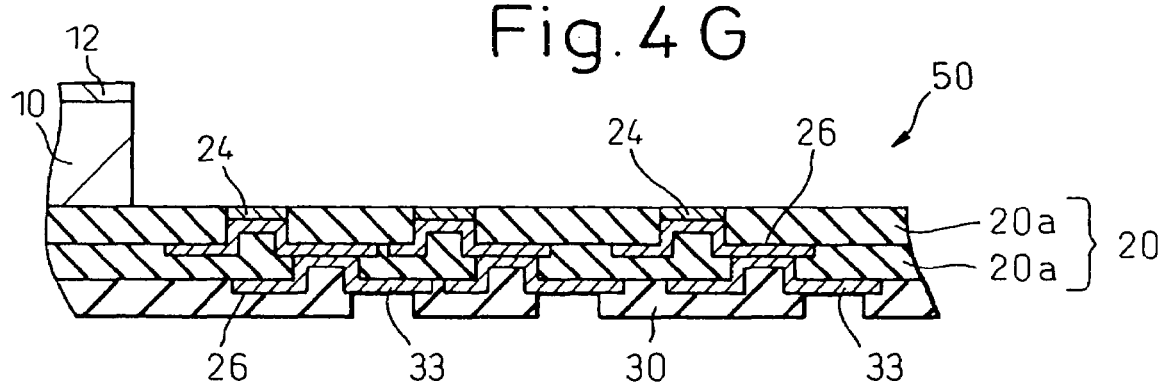

As shown in FIG. 4F, nickel film 12 of intermediate 34 is patterned, and the section corresponding to opening 18 (FIG. 1) for arranging a semiconductor element is removed to expose the central portion of copper sheet 11. Continuing, the exposed portion of copper sheet 11 is removed by etching by using the remaining nickel film 12 as a mask, allowing the obtaining of multilayered substrate 50 for a semiconductor device in which copper frame 10 is joined to the face for mounting a semiconductor element of multilayered substrate body 20 as shown in FIG. 4G. During etching of copper sheet 11, a mask sheet is attached to the face for external connection terminals on which external connection terminal pads of multilayered substrate body 20 are formed.

An etching liquid that etches copper sheet 11 but does not etch solder layers 24 is used for the etching liquid for copper sheet 11.

In multilayered substrate 50 for a semiconductor device fabricated in this manner, copper frame 10 acts as a reinforcing sheet for multilayered substrate 50 for a semiconductor device together with insulation treated metal sheet 30, and is thus able to improve the strength of the substrate. In particular, since multilayered substrate 50 for a semiconductor device obtained with the production method shown in FIGS. 4A through 4G has multilayered substrate body 20, composed mainly from resin, juxtapositioned between frame-shaped copper sheet 10 and insulation treated metal sheet 30, its strength can be further improved. Moreover, warping of multilayered substrate 50 can be effectively prevented, and handling during transport and so forth can be facilitated.

In addition, according to the multilayered substrate 50 for a semiconductor device (FIG. 1), since conductor wiring 26 of multilayered substrate body 20 are formed by a method in which they are formed in multiple layers between insulating resin layers 20a from one side of copper sheet 11, the face on which semiconductor element 39 is mounted can be formed as flat as possible, and its thickness can be formed as thin as possible in comparison with a multilayered substrate produced by a method in which a core substrate is used and multilayered conductor wiring layers are formed on both sides of the core substrate.

Multilayered substrate 50 for a semiconductor device is able to provide a packaged semiconductor device by attaching external connection terminals in the form of solder balls 38 to external connection terminal pads 33, and contacting electrode terminals 40 of a semiconductor element 39 to solder layers 24 formed as semiconductor element pads, followed by reflowing the solder.

In the production method of a multilayered substrate for a semiconductor device as previously explained, although a compound metal sheet 14 was used in which two copper sheets 11, on which a metal film in the form of nickel film 12 is formed on one side, are laminated into a single structure so that the nickel films 12 are on the inside, a compound metal sheet may also be used in which two copper sheets are integrated into a single structure without forming nickel films. In this case, during removal of the portion corresponding to opening 18 (FIG. 1) for arranging a semiconductor element of the copper sheet that composes the intermediate, it is necessary to perform etching by forming an etching resist film or placing a mask sheet at the portion of copper sheet 11 that is not to be etched.

Figure 8A:
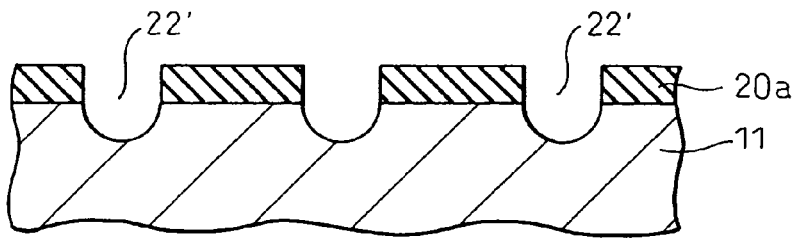
Figure 8B:
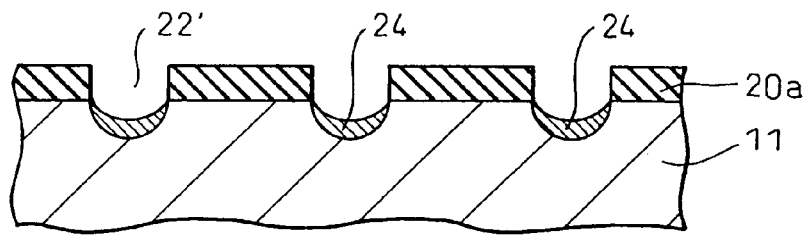
Figure 8C:
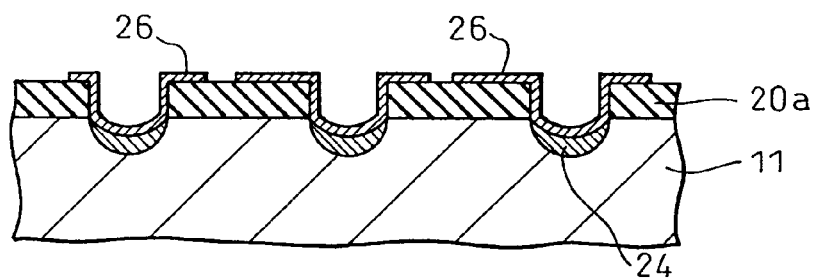

After forming openings 22 (FIG. 4B) for forming vias in insulating resin layers 20a formed on both sides of compound metal sheet 14, etching or laser processing may be performed on the portions of copper sheet 11 exposed in the bottoms of the openings 22 formed in insulating resin layer 20a to provide recesses 22' in which the bottoms are formed in copper sheet 11 passing through insulating resin layer 20a, as shown in FIG. 8A. After forming solder layer 24 for semiconductor element mounting pads by electrolytic plating of the bottoms of these recesses 22' using copper sheet 11 as the power supply layer, as shown in FIG. 8B, conductor wiring layers 26 are formed by a known method (FIG. 8C).

Figure 8D:
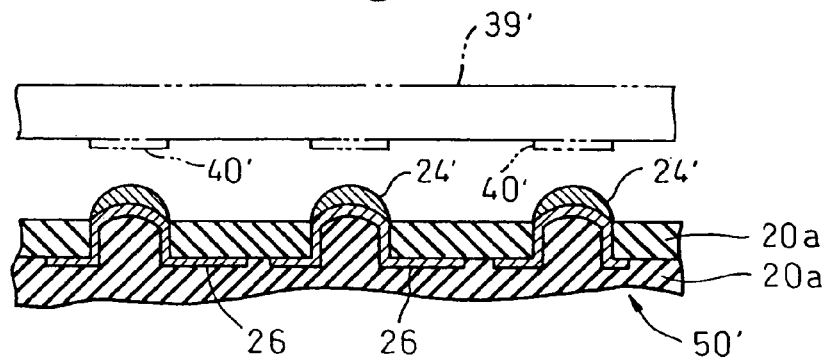

In a multilayered substrate 50' for a semiconductor device fabricated with this method, semiconductor element connection pads 24' can be formed in the shape of bumps protruding from the surface of the outermost insulating resin layer 20a, as shown in FIG. 8D. The use of such a multilayered substrate for a semiconductor device in which these bump-shaped semiconductor element pads 24' are formed enables a semiconductor element 39' to be easily and directly joined to the multilayered substrate of the present invention by means of these bump-shaped pads 24' even if the semiconductor element 39, is provided with electrode terminals 40' having flat tips.

Figure 9A:
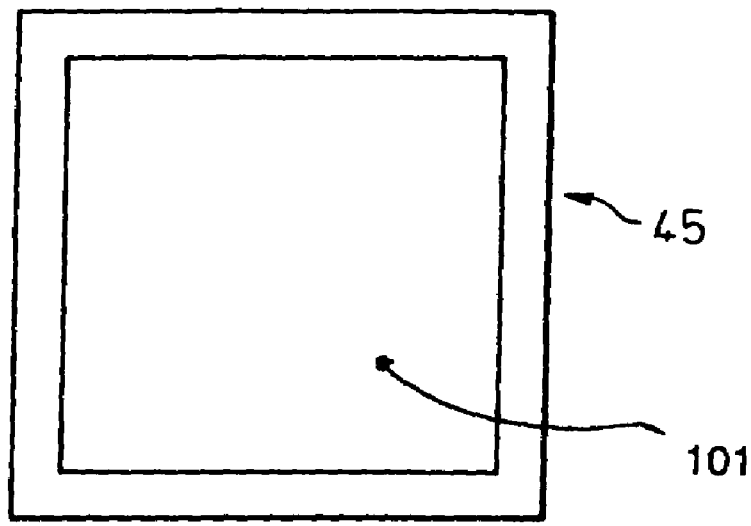
Figure 9B:
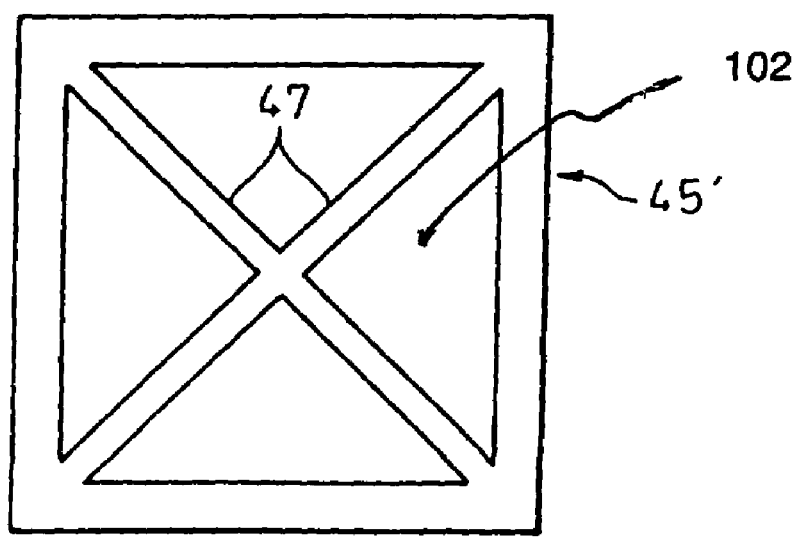
Figure 10:
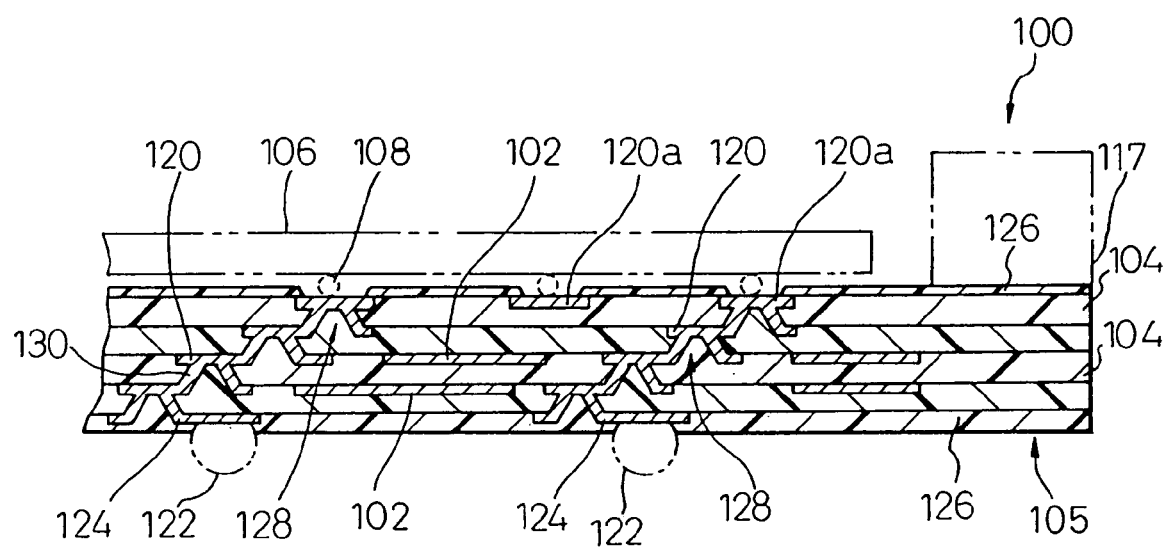
FIG. 10 is a partial cross-sectional view of a multilayered substrate for a semiconductor device of the prior art.
Figure 11A:
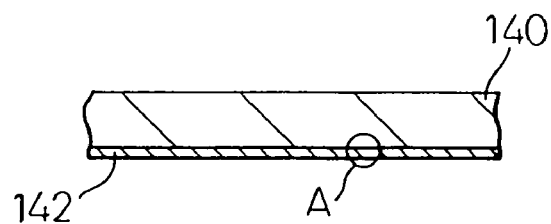
FIGS. 11A through 11F illustrate a production method of a multilayered substrate for a semiconductor device of the prior art.
Figure 11B:
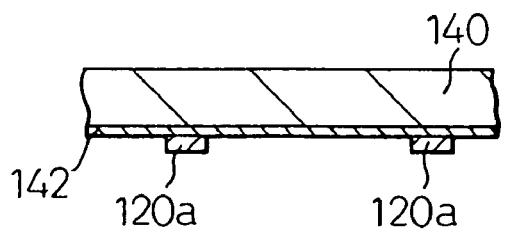
Figure 11C:
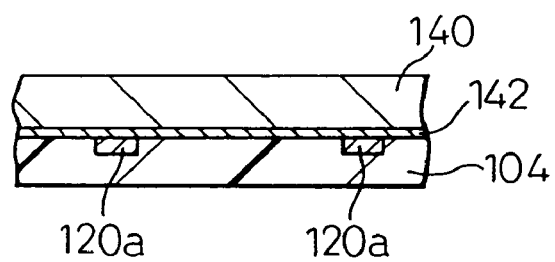
Figure 11D:
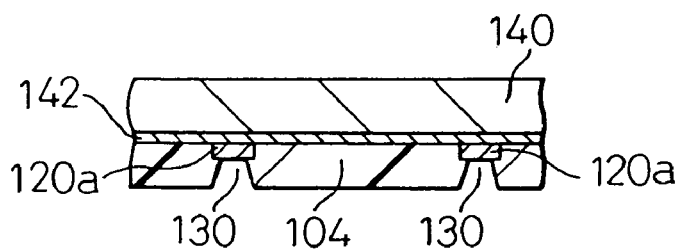
Figure 11E:
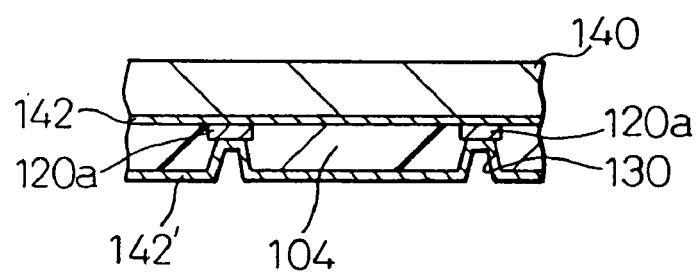
Figure 11F:
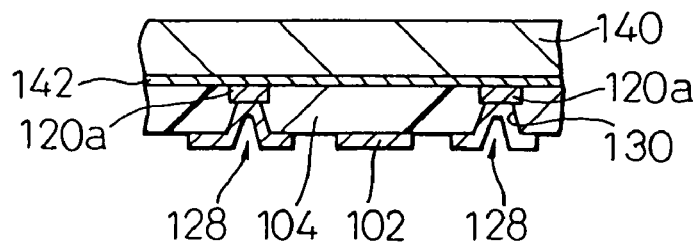
Figure 12:
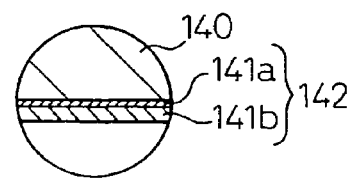
FIG. 12 is a partially enlarged section of the portion, indicated by circle A, of the copper sheet of FIG. 11A, showing construction of a seed layer provided on its surface.
Figure 13:
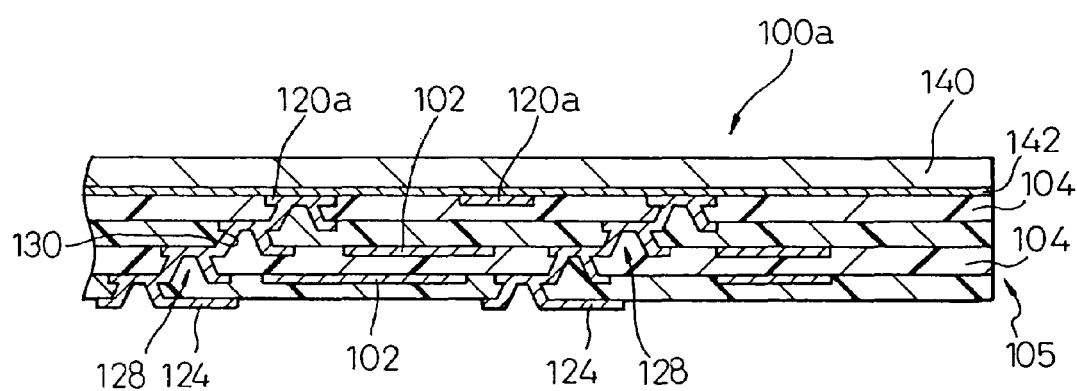
FIG. 13 is a partial cross-sectional view of an intermediate obtained in the production method of a multilayered substrate for a semiconductor device shown in FIG. 11.

In the multilayered substrate for a semiconductor device as explained above, insulation treated metal sheet 30, on which insulation treatment has been performed over the entire surface, including the inner wall surfaces of through holes 28 formed so as to correspond to each of external connection terminal pads 33, is joined to the face for external connection terminals as a reinforcing material as shown in FIG. 1. A metal frame 45 similar to that joined to the face for mounting a semiconductor element, as shown in FIG. 9A, or a frame 45' provided with cords in the form of band-shaped reinforcing members 47, as shown in figure 9B, may be used for the reinforcing material for the for the multilayered substrate for a semiconductor device. Reference numerals 101 and 102 in FIGS. 9A and 9B represents the visible faces of the semiconductor substrate. These frames 45 and 45' may be fabricated from a metal material that has not undergone insulation treatment of its surface provided they do not come in direct contact with external connection terminal pads 33. When these frames 45 and 45' are joined to the face for external connection terminals of multilayered substrate body 20, a plurality of external connection terminal pads 33 are located in the opening frames 45 and 45'.

The vias of the multilayered substrate for a semiconductor device 50 (FIG. 1) of the present invention may be formed by filling a metal into openings 22 of insulating resin layers 20a (FIG. 4B) by plating. In addition, a plurality of multilayered substrate bodies 20 may be formed on a single copper sheet 11 used as a metal sheet, and a plurality of multilayered substrates 50 for a semiconductor device may be formed all at once.

As has been explained above, according to the present invention, a thin and lightweight multilayered substrate for a semiconductor device can be used without the occurrence of warping and having improved reliability. Moreover, the strength of the multilayered substrate for a semiconductor device of the present invention can be improved, enabling it to facilitate handling during transport and so forth.

The invention claimed is:

1. A reinforced multilayered substrate for a semiconductor device, said reinforced multilayered substrate comprising:
   a body having a first face side and a second face side;
   a plurality of laminates disposed on at least one face side and overlying one another, each laminate comprising a conductor layer and an insulation layer;
   a plurality of pads, through which the substrate is electrically connectable to a semiconductor element to be mounted thereon, disposed on the outside of said multilayered substrate body on the first face side;
   a plurality of external connection terminals, through which the substrate is electrically connectable to an external electrical circuit, disposed on the outside of said multilayered substrate body on the second face side;
   a first metal reinforcing layer disposed on the first face side and reinforcingly connected to said multilayered substrate body, wherein said first metal reinforcing layer comprises an opening so as to allow the insertion of a semiconductor element for the electrical connection to the body of the substrate; and a second reinforcing metal layer in the form of a frame disposed on the second face side and reinforcingly connected to said multilayered substrate body, wherein said second reinforcing layer comprises openings such as not to prevent access to electrically connect external connection terminals to an external electrical circuit, and has a strength and a coefficient of thermal expansion substantially similar to those of the first metal reinforcing layer, wherein said reinforced multilayered substrate is substantially flat and unwarped by differences in thermal expansion between layers.

* * * * *